US012638493B2

(12) United States Patent
Dowleswarapu et al.

(10) Patent No.: US 12,638,493 B2
(45) Date of Patent: May 26, 2026

(54) TEMPERATURE COMPENSATION FOR A CURRENT SENSE CIRCUIT

(71) Applicant: TEXAS INSTRUMENTS INCORPORATED, Dallas, TX (US)

(72) Inventors: Anil Dowleswarapu, Hyderabad (IN); Subramanian Narayan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 139 days.

(21) Appl. No.: 18/362,744

(22) Filed: Jul. 31, 2023

(65) Prior Publication Data

US 2025/0044343 A1     Feb. 6, 2025

(51) Int. Cl.
*G01R 31/27* (2006.01)
*G01R 19/165* (2006.01)

(52) U.S. Cl.
CPC ....... *G01R 31/27* (2013.01); *G01R 19/16519* (2013.01)

(58) Field of Classification Search
None
See application file for complete search history.

(56) References Cited

U.S. PATENT DOCUMENTS

| | | | |
|---|---|---|---|
| 6,888,401 B1 * | 5/2005 | Tanase | G05F 3/262 |
| | | | 327/543 |
| 9,217,777 B2 * | 12/2015 | Knill | G01R 31/382 |
| 9,882,482 B1 * | 1/2018 | Hendry | H02M 3/158 |
| 10,852,329 B2 * | 12/2020 | Fernandez | H03F 3/45475 |
| 2010/0308750 A1 * | 12/2010 | Cross | H05B 45/397 |
| | | | 315/307 |
| 2019/0379270 A1 * | 12/2019 | Pullen | H02M 3/1588 |
| 2025/0181090 A1 * | 6/2025 | S | H03K 5/24 |

* cited by examiner

*Primary Examiner* — Jermele M Hollington
(74) *Attorney, Agent, or Firm* — Xianghui Huang; Frank D. Cimino

(57) ABSTRACT

An integrated circuit includes a current sense circuit having an input, an output, and a correction current input terminal between the input and output. A first transistor has a first control input and a first terminal. The first terminal is coupled to the input of the current sense circuit. A second transistor has a second control input and a second terminal. The second control input is coupled to the first control input, and the second terminal is coupled to the correction current input terminal.

24 Claims, 4 Drawing Sheets

*100*

TEMPERATURE COMPENSATION FOR A CURRENT SENSE CIRCUIT

BACKGROUND

A current sense circuit may generate an output signal (e.g., a voltage) that is proportional to a current through a transistor (sometimes referred to as the main transistor) coupled to the input of the current sense circuit. The transistor whose current is sensed by the current sense circuit may have a different temperature coefficient than a smaller, sense transistor included within the current sense circuit. Because of the disparate temperature coefficients of the main transistor and the sense transistor, the magnitude of the output signal from the current sense circuit may have an error. The magnitude of the error may be a function of the magnitude of the current through the main transistor—a larger main transistor current causes a larger error in the output signal from the current sense circuit.

SUMMARY

In an example, an integrated circuit includes a current sense circuit having an input, an output, and a correction current input terminal between the input and output. A first transistor has a first control input and a first terminal. The first terminal is coupled to the input of the current sense circuit. A second transistor has a second control input and a second terminal. The second control input is coupled to the first control input, and the second terminal is coupled to the correction current input terminal.

DETAILED DESCRIPTION

Figure 1:
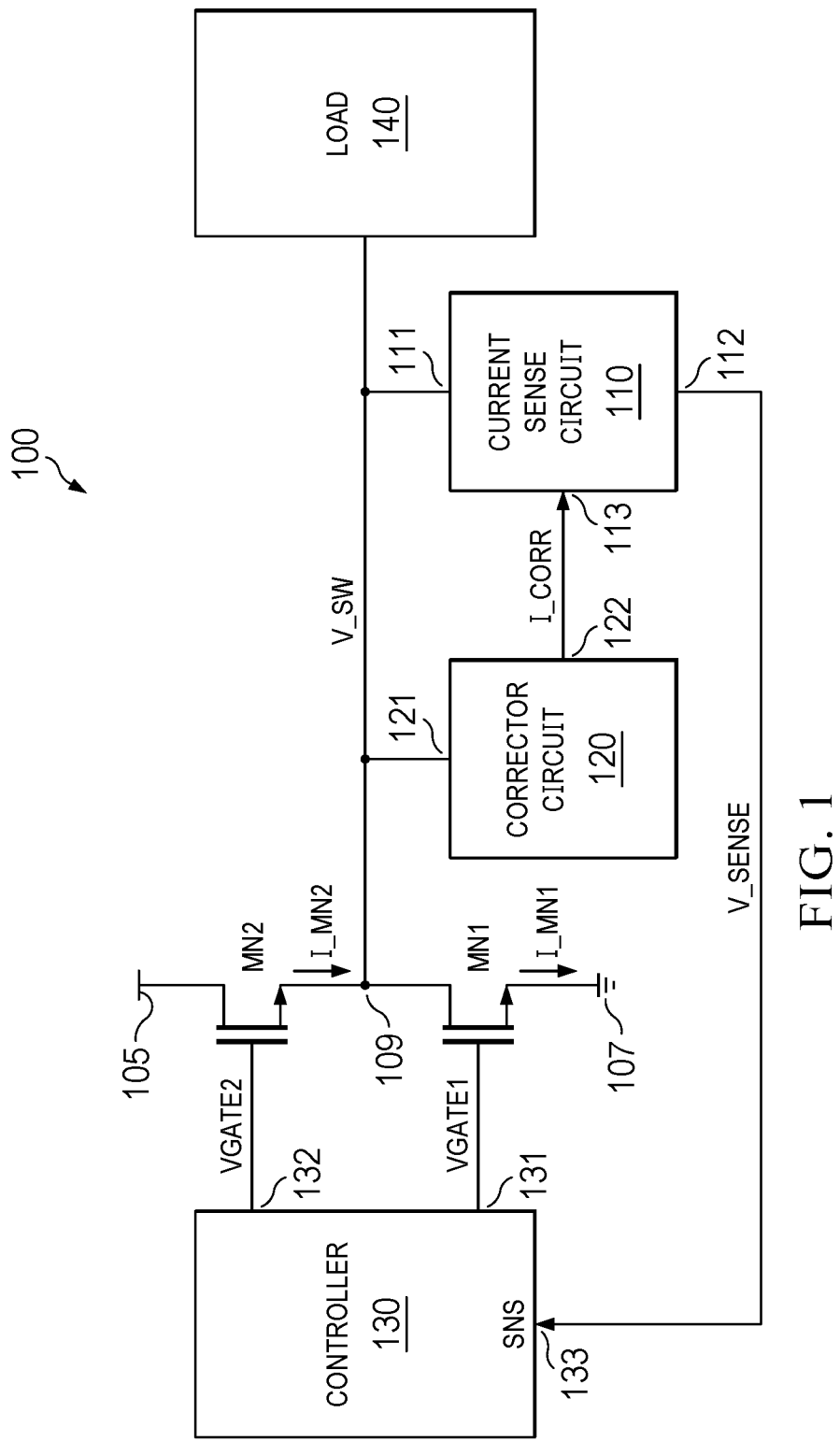
FIG. 1 is a block and schematic diagram of an example system including a current sense circuit and a corrector circuit.

The same reference numbers or other reference designators are used in the drawings to designate the same or similar (either by function and/or structure) features.

FIG. 1 is a block and schematic diagram of a system 100 which includes a controller 130, transistors MN1 and MN2, a current sense circuit 110, a corrector circuit 120, and a load 140. In one example, the components shown in FIG. 1 are fabricated on a common semiconductor die (integrated circuit, IC). In other examples, two or more of the components of FIG. 1 can be fabricated on different ICs.

As shown, transistors MN1 and MN2 are coupled between a supply voltage terminal 105 and a supply voltage reference terminal 107. The supply voltage terminal 105 provides a first supply voltage, e.g., from a voltage supply, not shown). The supply voltage terminal 107 provides a second supply voltage, e.g., electrical ground). For instance, the first supply voltage is larger than the second supply voltage. In this example, transistors MN1 and MN2 are n-channel field effect transistors (NFETs). In other examples, MN1 and MN2 may be implemented as different types of transistors. The source of transistor MN2 is coupled to the drain of transistor MN1 at a switching terminal 109. Controller 130 has control outputs 131 and 132. Control output 131 is coupled to the gate of transistor MN1 and provides voltage VGATE1 to the gate of transistor MN1. Control output 132 is coupled to the gate of transistor MN2 and provides voltage VGATE2 of the gate of transistor MN2. Controller 130 may include gate drivers for each of transistors MN1 and MN2, or gate drivers may be included between control outputs 131/132 and the gates of transistors MN1/MN2.

Load 140 is coupled to the switching terminal 109. Load 140 may be any type of load powered by system 100. In one example, load 140 includes a motor. In the example of a motor, the motor may be a three-phase motor, and the series combination of transistors MN1 and MN2 is a single phase of a three-phase inverter—the other two phases may be similarly constructed. In another example, load 140 is an audio device (e.g., a speaker), and system 100 is an audio amplifier. In yet other examples, system 100 may be a power converter (e.g., a switching voltage converter such as a buck converter, boost converter, buck-boost converter, etc.). In the examples of a power converter, load 140 may include one or more of an inductor, a capacitor, a circuit powered by the voltage provided by system 100, etc.

Current sense circuit 110 has an input 111, an output 112, and a correction current input terminal 113. As shown, correction current input terminal 113 is coupled to an output 122 of the corrector circuit 120. Input 111 of current sense circuit 110 is coupled to the switching terminal 109, and thereby to the source of transistor MN2 and to the drain of transistor MN1. Output 112 of current sense circuit 110 is coupled to a sense (SNS) input 133 of controller 130. Corrector circuit 120 includes an input 121 and the output 122. Input 121 of corrector circuit 120 is coupled to switching terminal 109. As described above, output 122 of corrector circuit 120 is coupled to the correction current input terminal 113.

Controller 130 can turn on and off each of transistors MN1 and MN2. Responsive to controller 130 turning on transistor MN2, a voltage (V_SW) on the switching terminal 109 is pulled upward towards the voltage on the supply voltage terminal 105 and current I_MN2 flows through transistor MN2. Responsive to controller 130 turning on transistor MN1, the voltage V_SW is pulled downward towards the voltage on the supply voltage reference terminal 107, and current I_MN1 flows through transistor MN1. Controller 130 does not turn on both transistors MN1 and MN2 at the same time. Accordingly, the voltage V_SW on the switching terminal 109 may be a square wave having a duty cycle implemented by controller 130.

Some applications benefit from sensing the magnitude of the current through either or both of the transistors MN1 and MN2. The examples described herein pertain to sensing the current I_MN1 through transistor MN1 but can be extended to sensing the current I_MN2 through transistor MN2. When transistor MN1 is on, the drain-to-source voltage (Vds) of transistor MN1 is equal to the product of current I_MN1 and the on-resistance (Rdson) of transistor MN1, that is, $Vds=I_{MN1}*Rdson$. Thus, assuming a constant value of Rdson, the Vds of transistor MN1 is proportional to the transistor's drain current I_MN1. Using input 111, current sense circuit 110 senses the Vds of transistor MN1, which is proportional to current I_MN1. At output 112, current sense circuit 110 generates an output voltage V_SENSE, which is proportional to the Vds of transistor MN1 and thus proportional to current I_MN1.

Current sense circuit 110 determines current I_MN1 through transistor MN1 by measuring the transistor's Vds. As described above, the transistor's Vds is proportional to current I_MN1 as long as Rdson is a constant. However, a transistor's Rdson is a function of temperature. For example, the Rdson of transistor MN1 has a positive temperature coefficient. As the transistor's temperature increases, so does the transistor's Rdson. Thus, the Vds of transistor MN1 is a function of both current I_MN1 and Rdson. Thus, the temperature coefficient of Rdson introduces an error when using a measurement of Vds to sense current I_MN1.

The power dissipated by transistor MN1 is proportional to $(I_{MN1}{}^2{}^*Rdson{}^*\theta j)$, where $\theta j$ is a package thermal coefficient (in units of, for example, degrees per watt). Within a relatively narrow range of current I_MN1, the error introduced by the temperature variation of Rdson may be small enough so as to not matter for some applications. However, for some applications (e.g., motor controllers or audio amplifiers), the current I_MN1 may vary through a wide range, and the error caused by the temperature dependence of Rdson may significantly affect the accuracy of the current sensing of transistor MN1 and the performance of the system. Corrector circuit 120 generates a correction current I_CORR at its output 122. Correction current I_CORR is supplied to current sense circuit 110 to modify the magnitude of its output voltage V_SENSE to reduce the error otherwise introduced into V_SENSE due to the temperature dependence on Rdson of transistor MN1.

Figure 2:
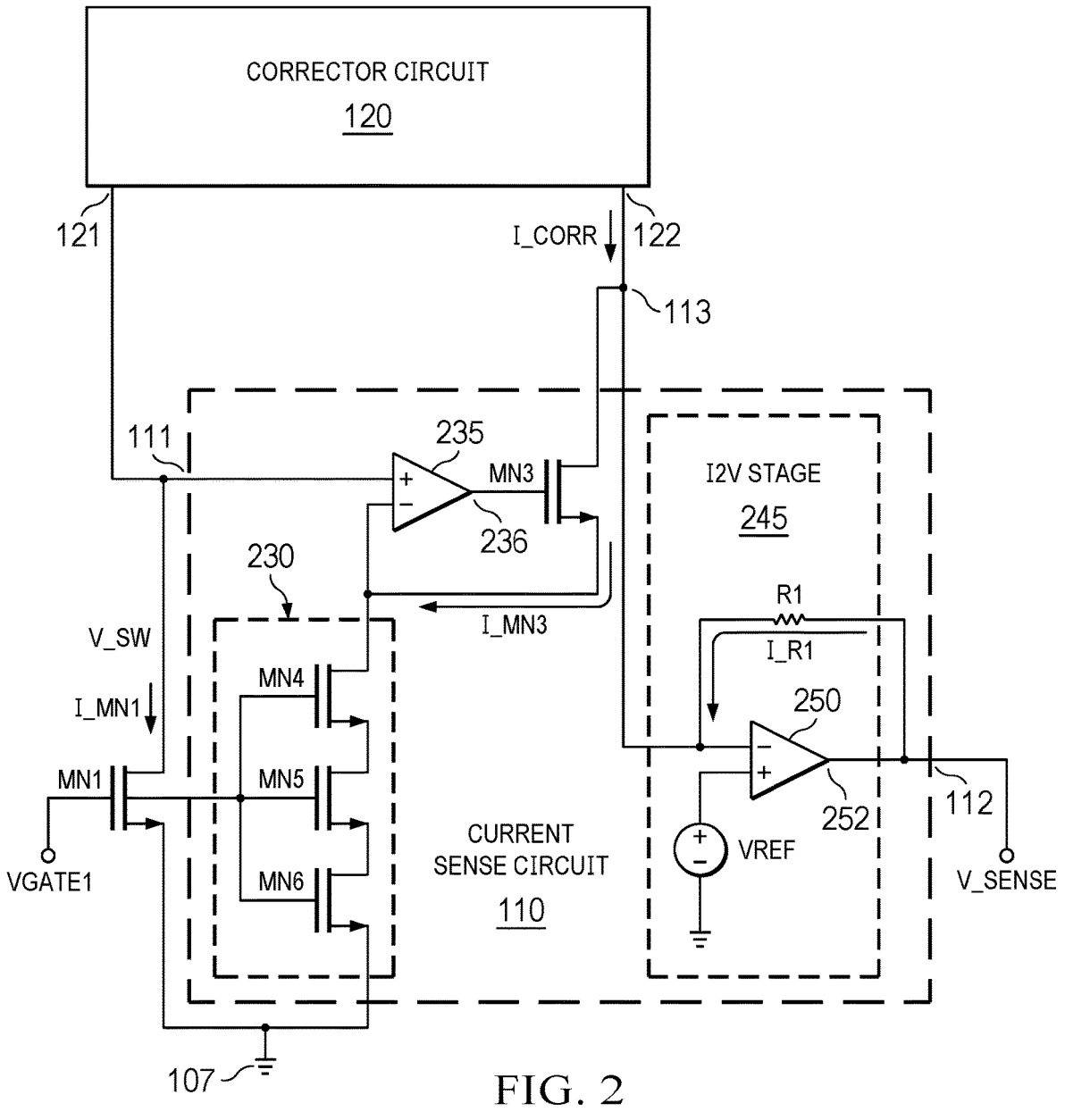
FIG. 2 is a schematic diagram illustrating an example of the current sense circuit of FIG. 1.

FIG. 2 illustrates a circuit schematic of an example of current sense circuit 110 and its coupling to corrector circuit 120. In this example, current sense circuit 110 includes a sense transistor circuit 230, an operational amplifier (OP AMP) 235, a transistor MN3, and a current-to-voltage (I2V) stage (or circuit) 245. The input 111 of the current sense circuit 110 is coupled to the positive (+) input of OP AMP 235. Sense transistor circuit 230 includes transistors MN4, MN5, and MN6 coupled in series between the negative (−) input of OP AMP 235 and the supply voltage reference terminal 107. In this example, transistors MN4-MN6 are NFETs but can be other than NFETs in other examples. Further, the number of transistors of the sense transistor circuit 230 can be other than three (e.g., 1, 2, 4, etc.). The gates of transistors MN4-MN6 are coupled together and to the gate of transistor MN1. The size (e.g., the ratio of channel width (W) to channel length (L)) of each of the transistors MN4-MN6 is smaller than transistor MN1. In one example, the size of each of transistors MN4-MN6 is 5000 times smaller than the size of transistor MN1.

Transistor MN3 is an NFET in the example of FIG. 2 but can be other than an NFET in other examples. The output 236 of OP AMP 235 is coupled to the gate of transistor MN3. I2V stage 245 includes an OP AMP 250, a reference voltage source VREF, and a resistor R1. Resistor R1 is coupled between the output 252 of OP AMP 250 and the negative input of OP AMP 250. Namely, a first terminal of resistor R1 is coupled to the output 252 of OP AMP 250, and a second terminal of resistor R1 is coupled to the negative input of OP AMP 250. The output 252 of the OP AMP 250 is coupled to the output 112 of current sense circuit 110. The reference voltage source VREF is coupled to the positive input of OP AMP 250 and to the supply voltage reference terminal 107. One terminal (e.g., the drain) of transistor MN3 is coupled to resistor R1 and to the negative input of OP AMP 250, and another terminal (e.g., the source) of transistor MN3 is coupled to the sense transistor circuit 230.

Current sense circuit 110 operates as following, assuming no error is introduced by the temperature dependence of the Rdson of transistor MN1. The gate voltage VGATE1 provided to the gate of transistor MN1 is also provided to the gates of transistors MN4, MN5, and MN6. The drain current through a field effect transistor is, among other things, a function of the gate-to-source voltage (Vgs) of the transistor. Thus, the current through the serially-connected stack of transistors MN4-MN6 is a function of the Vgs of transistor MN1. The current through the serially-connected stack of transistors MN4-MN6 is the current through transistor MN3, and is labeled as current I_MN3 in FIG. 2. At steady state, the voltages on the inputs of an OP AMP are approximately equal. Thus, the voltage V_SW provided to the positive input of OP AMP 235 is approximately equal to the voltage on the negative input of OP AMP 235. Accordingly, the voltage provided across the serially-connected stack of transistors MN4-MN6 is approximately equal to the Vds of transistor MN1.

Because transistors MN4-MN6 are smaller than transistor MN1, the Rdson of each of transistors MN4-MN6 is proportionately larger than the Rdson of transistor MN1. Also, because transistors MN4-MN6 have a larger Rdson and because the voltage between the drain of transistor MN4 and the supply voltage reference terminal 107 is the same as the Vds of transistor MN1, current I_MN3 is proportional to, but substantially smaller than, current I_MN1 through transistor MN1. The magnitude of current I_MN3 may be a scaled down version of current I_MN1. For example, the scaling is by the relative size difference of MN1 compared to the sizes of transistors MN4-MN6. For example, if transistors MN4-MN6 are 5000 times smaller than transistor MN1, then current I_MN3 is 5000 times smaller than current I_MN1.

The current from the output 252 of OP AMP 250 through resistor R1 is labeled current I_R1. Ignoring the functionality of corrector circuit 120 and the correction current I_CORR it provides, current I_R1 is equal to current I_MN3. Accordingly, current I_R1 flows from the output 252 of OP AMP 250, through resistor R1, transistor MN3 (labeled as current I_MN3), and through the sense transistor circuit 230 to the supply voltage reference terminal 107. Because the current through the sense transistor circuit 230 is proportional to current I_MN1 being sensed, the current through resistor R1 is also proportional to current I_MN1. The reference voltage source VREF ('VREF' refers both to a circuit that generates the reference voltage as well as the reference voltage itself) provided to the positive input of OP AMP 252 is also provided at the negative input of OP AMP 250. Thus, the voltage at the output 252 of OP AMP 250, which is also the output 112 of the current sense circuit 110, is given as: V_SENSE=VREF+(I_R1*R1). Accordingly, V_SENSE is proportional to current I_R1. Because, as described above, current I_R1 is a function of current I_MN1, V_SENSE is proportional to current I_MN1 being sensed.

As described above, however, the Rdson of transistor MN1 is a function of the temperature of transistor MN1. Current I_MN1 through transistor MN1 self-heats the transistor, thereby causing the transistor's Rdson to increase as current I_MN1 increases. Transistors MN4-MN6 may be far enough away from transistor MN1 that the temperature of transistors MN4-MN6 is not impacted much by the self-heating that transistor MN1 experiences. Accordingly, the Rdson of transistors MN4-MN6 may not vary as much as the Rdson of transistor MN1. As a result of the different effect of temperature on Rdson of transistor MN1 versus transistors MN4-MN6, current I_MN3 through the sense transistor circuit 230 may not be proportional only to current I_MN1 but may also be a function I_MN1$^2$ and possibly higher order current terms as well.

The correction current input terminal 113 is coupled to resistor R1, the negative input of OP AMP 250, and the drain of transistor MN3. The output 122 of corrector circuit 122 is coupled to the correction current input terminal 113. Corrector circuit 120 receives voltage V_SW at its input 121. Voltage V_SW is the same voltage that current sense circuit 110 receives as an input to sense current I_MN1, as described above. Corrector circuit 120 generates the correction current I_CORR, and provides the correction current I_CORR at its output 122. In one example, corrector circuit 120 generates I_CORR based on the square of voltage V_SW. The current I_MN3 is the sum of currents I_CORR and I_R1. Accordingly, $$I\_MN3 = I\_CORR + I\_R1 \qquad \text{(Eq. 1)}$$

Current I_CORR can be bidirectional depending on the direction of I_MN1 through transistor MN1. The magnitude of current I_MN3 is set by sense transistor circuit 230 based on the Vgs and Vds of transistor MN1, as described above. The magnitude of current I_CORR is set by corrector circuit 120 based on the magnitude of voltage V_SW (e.g., I_CORR∝V_SW$^2$). With currents I_MN3 and I_CORR set by their respective circuits, current I_R1 through resistor R1 is forced to be the difference between I_MN3 and I_CORR. The correction current I_CORR that is injected into the correction current input terminal 113 affects the magnitude of the current I_R1 through the I2V stage 245 of the current sense circuit 110. Larger values of the correction current I_CORR causes decreases in current I_R1 through resistor R1 and thus smaller magnitudes of voltage V_SENSE produced by the current sense circuit 110.

Without corrector circuit 120, as the Vgs of transistor MN1 increases to produce larger levels of current I_MN1, the temperature of transistor MN1 rises. As the temperature of transistor MN1 rises, the value of Rdson of transistor MN1 also rises. The voltage V_SW is proportional to the product of current I_MN1 and Rdson. Increases in voltage V_SW thus may be, in part, due to the self-heating of transistor MN1. Current sense circuit 110 uses voltage V_SW as a proxy for current I_MN1. Current I_MN3 is a function of voltage V_SW, which may increase due, in part, to the self-heating of transistor MN1. An increase in current I_MN3 due to self-heating of transistor MN1 thus causes the voltage drop across resistor R1 to increase and thus the voltage V_SENSE to increase as well.

Corrector circuit 120, however, corrects the magnitude of voltage V_SENSE based on the square of voltage V_SW. For example, the current I_CORR from the corrector circuit 120 causes the current I_R1 through resistor R1 to decrease, thereby causing a decrease in voltage V_SENSE to a level that has substantially less error than would have been the case absent corrector circuit 120.

Figure 3:
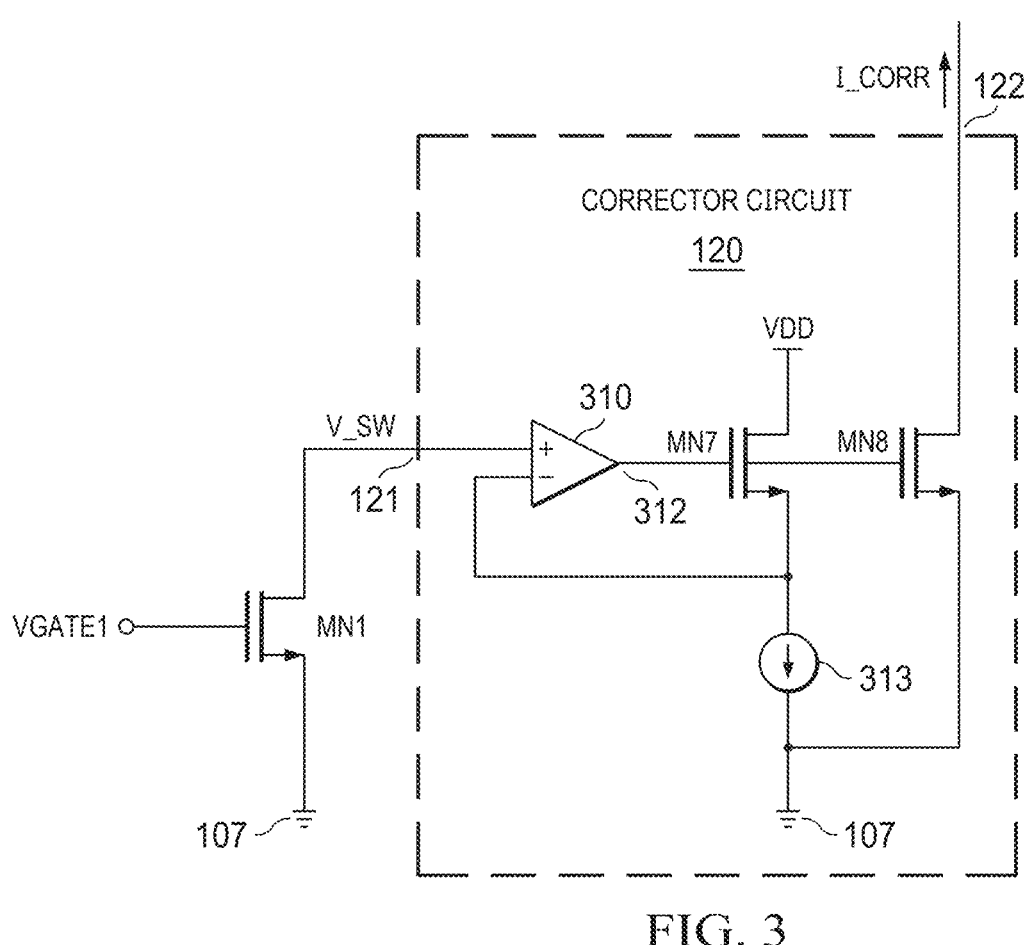
FIG. 3 is a schematic diagram of an example of the corrector circuit of FIG. 1.

FIG. 3 is a schematic diagram of an example corrector circuit 120. In this example, corrector circuit 120 includes OP AMP 310, transistors MN7 and MN8, and a current source 313. The positive input of OP AMP 310 is coupled to the input 121 of corrector circuit 120 and thus receives voltage V_SW. Transistors MN7 and MN8 are NFETs in this example but can be other than NFETs in other examples (e.g., p-channel field effect transistors, PFETs). In one example, transistors MN7 and MN8 are constructed such that their threshold voltages (Vt) are approximately equal. The output 312 of OP AMP 310 is coupled to the gates of transistors MN7 and MN8. The source of transistor MN7 is coupled to the negative input of OP AMP 310. Current source 313 is coupled between the source of transistor MN7 and the supply voltage reference terminal 107. Namely, a first terminal of the current source 313 is coupled to the source of transistor MN7, and a second terminal of the current source 313 is coupled to the supply voltage reference terminal 107. The source of transistor MN8 is coupled to the supply voltage reference terminal 107. The drain of transistor MN8 is coupled to the output 122 of corrector circuit 120. The current through transistor MN8 is the current I_CORR, as described above.

The negative input of OP AMP 310 is approximately equal to voltage V_SW, and thus source of transistor MN7 is approximately equal to voltage V_SW. Current source 313 provides a bias current through transistor MN7 for proper operation of transistor MN7. OP AMP 310 controls the voltage on the gate of transistor MN7 and thus sets the gate-to-source voltage of transistor MN7 to accommodate the magnitude of the current produced by current source 313. The voltage on the gate of transistor MN7 is the threshold voltage (Vt) of transistor MN7 above its source voltage. Thus, the gate voltage of transistor MN7 is (V_SW+Vt). Because the gates of transistors MN7 and MN8 are coupled together, the voltage on the gate of transistor MN8 also is (V_SW+Vt). The equation of the drain current (Id) of a field effect transistor is:

$$Id = K(Vgs - Vt)^2 \qquad \text{(Eq. 2)}$$

where K includes constants relative to transistor MN1. In one example, K=(k'/2)*W/L*(1+λVds), where k' is the product of the charge-carrier effective mobility (μ0) and the gate oxide capacitance per unit area (Cox), and λVds is the channel-length modulation parameter.

Eq. (2) shows that the drain current through a field effect transistor is proportional to the square of the difference between the Vgs and Vt voltages for the transistor. The Vgs of transistor MN8 is (V_SW+Vt). The difference between the Vgs of transistor MN8 and its threshold voltage Vt is (V_SW+Vt)−Vt, which equals V_SW. Thus, the current I_CORR is proportional to the square of voltage V_SW.

Figure 4:
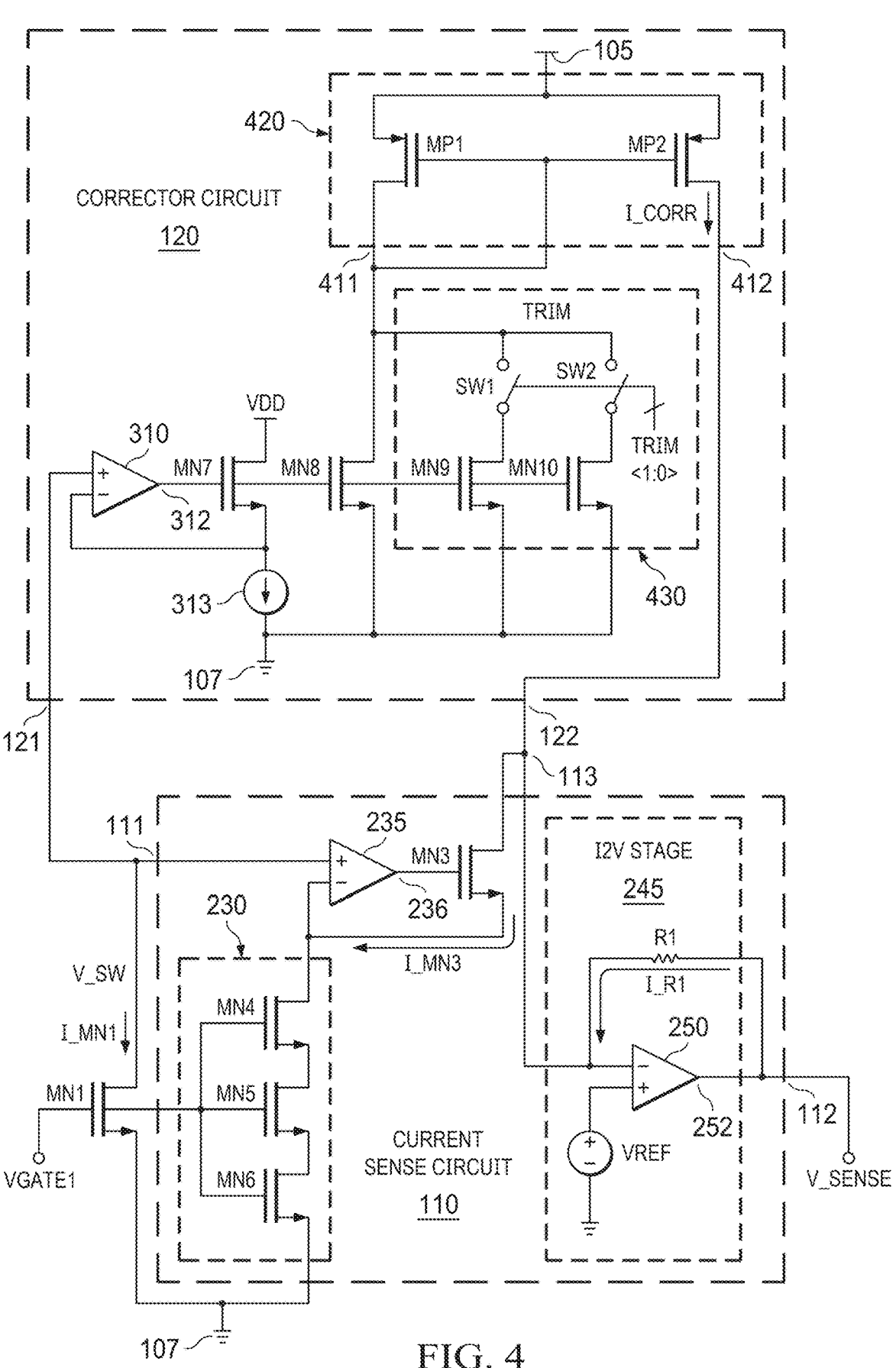
FIG. 4 is a schematic diagram of another example of the corrector circuit of FIG. 1.

FIG. 4 is a schematic diagram including transistor MN1, current sense circuit 110, and another example of corrector circuit 120. In the example of FIG. 4, corrector circuit 120 includes OP AMP 310, transistors MN7 and MN8, and current source 313, as described above. Corrector circuit 120 in FIG. 4 also includes a current mirror 420 and a trim circuit 430. Current mirror 420 includes PFETs MP1 and MP2 whose gates are coupled together and whose sources are coupled together and to the supply voltage terminal 105 or to an intermediate voltage terminal (a voltage that is smaller than the voltage on the supply voltage terminal 105. Current mirror 420 has a current mirror input 411 and a current mirror output 412. The drains of transistors MP1 and MP2 are coupled to the current mirror input 411 and to the current mirror output 412, respectively. The current mirror input 411 is coupled to the drain of transistor MN8. The current mirror output 412 is coupled to the correction current input terminal 113. As described above, the current through transistor MN8 is proportional to V_SW2. That current is mirrored by current mirror as the correction current I_CORR into the correction current input terminal 113.

In the example of FIG. 4, trim circuit 430 includes one or more series combinations of a transistor and a switch. Each series combination of the transistor and the switch is coupled in parallel with transistor MN8 between the current mirror input 411 (which is also coupled to the gates transistors MP1 and MP2) and the supply voltage reference terminal 107. In the example of FIG. 4, trim circuit 430 includes transistors MN9 and MN10 (e.g., NFETs) whose gates are coupled to the gate of transistor MN8, and whose sources are coupled to the source of transistor MN8. A separate switch (e.g., a transistor) is coupled to each of transistor MN9 and MN10. Switch SW1 is coupled to transistor MN9, and switch SW2 is coupled to transistor MN10. Each switch can enable or disable current flow through the corresponding transistor. When switch SW1 is closed, current can flow through transistor MN9, and when switch SW2 is closed, current can flow through transistor MN10. Each switch SW1, SW2 can be controlled by a trim control signal (Trim<1:0>). The trim control value can be stored in a register, memory, etc., for example within the IC in which corrector circuit 120 is included. One bit of the trim control value Trim<1:0> opens or closes switch SW1, and another bit opens or closes switch SW2. Although two transistors MN9 and MN10 are shown in trim circuit 430 in FIG. 4, any suitable number of transistors and corresponding switches can be included. Trim circuit 430 can be used, for example, to account for differences in different IC packages and processes.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, where appropriate, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input (also referred to as a control terminal) and its current terminals (also referred to as terminals). In the context of a FET, the control input is the gate, and the current terminals are the drain and source. In the context of a BJT, the control input is the base, and the current terminals are the collector and emitter.

References herein to a FET being "ON" or "enabled" means that the conduction channel of the FET is present and drain current may flow through the FET. References herein to a FET being "OFF" or "disabled" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent or +/−5 percent or +/−1 percent of that parameter or, if the parameter is zero, a reasonable range of values around zero.

Modifications are possible in the described embodiments, and other embodiments are possible, within the scope of the claims.

What is claimed is:

1. A device comprising:
   a current sense circuit having an input, an output, and a correction current terminal;
   a first operational amplifier having a first amplifier input, a second amplifier input, and a first amplifier output, the first amplifier input coupled to the current sense circuit input;
   a first transistor having a first control input and a first terminal, the first terminal coupled to the second amplifier input and the first control input coupled to the first amplifier output; and
   a second transistor having a second control input and a second terminal, the second control input coupled to the first control input, and the second terminal coupled to the correction current input terminal.

2. The device of claim 1, further comprising a current mirror coupled between the second terminal and the correction current terminal.

3. The device of claim 2, wherein the current mirror has a current mirror input and a current mirror output, the current mirror input coupled to the second terminal, and the current mirror output coupled to the correction current terminal.

4. An integrated circuit (IC) comprising:
   a current sense circuit having an input, an output, and a correction current input terminal; and
   a first transistor having a first control input and a first terminal, the first terminal coupled to the input of the current sense circuit;
   a second transistor having a second control input and a second terminal, the second control input coupled to the first control input, and the second terminal coupled to the correction current input terminal; and
   a trim circuit coupled to the second transistor.

5. The device of claim 1, further comprising a trim circuit coupled to the second transistor, wherein the second transistor includes a third terminal, and the trim circuit includes:
   a third transistor having a fourth terminal, a fifth terminal, and a third control input, the fifth terminal coupled to the third terminal, and the third control input coupled to the second control input; and
   a switch having a first switch terminal and a second switch terminal, the first switch terminal coupled to the fourth terminal, and the second switch terminal coupled to the second terminal.

6. The device of claim 1, wherein the current sense circuit includes:
   a second operational amplifier having a third amplifier input, a fourth amplifier input, and a second amplifier output, the third amplifier input coupled to the correction current terminal; and
   a resistor coupled between the second amplifier output and the third amplifier input.

7. The device of claim 1, wherein the first and second transistors are field effect transistors.

8. A circuit comprising:
   a first transistor having a first control terminal and a first terminal;
   a current sense circuit having an input, an output, and a correction current input terminal, the input of the current sense circuit coupled to the first terminal; and
   an operational amplifier having first and second operational amplifier inputs and an operational amplifier output, the first operational amplifier input coupled to the first terminal;
   a second transistor having a second control terminal and a second terminal, the second control terminal coupled to the operational amplifier output, and the second terminal coupled to the second operational amplifier input; and
   a third transistor having a third control input, and a third terminal, the third control input coupled to the second control input, and the third terminal coupled to the correction current terminal.

9. The circuit of claim 8, further comprising a current mirror coupled between the third terminal and the correction current terminal.

10. The circuit of claim 9, wherein the current mirror has a current mirror input and a current mirror output, the current mirror input coupled to the third terminal, and the current mirror output coupled to the correction current terminal.

11. The circuit of claim 8, further comprising a trim circuit coupled to the third transistor.

12. The circuit of claim 11, wherein the third transistor includes a fourth terminal, and the trim circuit includes a series combination of a fourth transistor and a switch, the series combination coupled to the third and fourth terminals.

13. The circuit of claim 8, wherein the operational amplifier is a first operational amplifier, the operational amplifier output is a first operational amplifier output, and the current sense circuit includes:
   a second operational amplifier having third and fourth operational amplifier inputs and a second operational amplifier output, the second operational amplifier input coupled to the correction current terminal; and
   a resistor coupled between the second operational amplifier output and the third operational amplifier input.

14. The circuit of claim 8, wherein the second and third transistors are field effect transistors.

15. A device comprising:
   a current sense circuit having an input and an output, the current sense circuit capable of producing a voltage at the output that is proportional to a voltage at the input; and
   a corrector circuit having a corrector input and a corrector output, the corrector input coupled to the input of the current sense circuit, and the corrector output coupled to the current sense circuit, the corrector circuit capable of providing a current at the corrector output that is proportional to a square of the voltage at the input of the current sense circuit.

16. The device of claim 15, further including a transistor coupled to the input of the current sense circuit, wherein the voltage at the input of the current sense circuit is proportional to a current through the transistor.

17. The device of claim 15, wherein the corrector circuit comprises:
   an operational amplifier having first and second inputs and first output, the first input coupled to the input of the current sense circuit;

a first transistor having a first control input and a first terminal, the first terminal coupled to the second input, and the first control input coupled to the first output; and a second transistor having a second control input and a second terminal, the second control input coupled to the first output, and the second terminal coupled to the corrector output.

18. The device of claim 17, further comprising a current mirror having a mirror input and a mirror output, the mirror input coupled to the second terminal, and the mirror output coupled to the corrector output.

19. The device of claim 18, wherein operational amplifier is a first operational amplifier, and the current sense circuit includes:

a second operational amplifier having third and fourth inputs and a second output, the third input coupled to the mirror output;

a resistor coupled between the second output and the third input; and a third transistor coupled between the third input and a supply terminal.

20. The device of claim 18, further comprising a trim circuit coupled to the second transistor, the trim circuit having a trim control input.

21. The device of claim 17, wherein the first and second transistors are field effect transistors.

22. The device of claim 1, wherein the second terminal is capable of providing a current at the correction current terminal that is proportional to a square of a voltage at the input of the current sense circuit.

23. The device of claim 1, wherein the device is integrated in an integrated circuit.

24. The device of claim 8, further comprising a current source having a first terminal and a second terminal, the first terminal of the current source coupled to the second terminal of the second transistor, and the second terminal of the current source coupled to a fourth terminal of the third transistor.

* * * * *